United States Patent
Havens et al.

[11] Patent Number: 5,973,582
[45] Date of Patent: Oct. 26, 1999

[54] RESONANCE IMAGER MOBILE VAN MAGNETIC FIELD HOMOGENEITY SHIFT COMPENSATION

[75] Inventors: Timothy John Havens; Chung-Yih Ho; Xianrui Huang; Steven Ho-Chong Wong; Bu-Xin Xu; Minfeng Xu, all of Florence, S.C.

[73] Assignee: General Electric Company, Milwaukee, Wis.

[21] Appl. No.: 09/195,128

[22] Filed: Nov. 18, 1998

[51] Int. Cl.[6] .................................................... H01F 7/00
[52] U.S. Cl. ...................... 335/301; 335/216; 324/318; 324/320
[58] Field of Search ................... 335/296–306; 324/318–320

[56] References Cited

U.S. PATENT DOCUMENTS 4,698,611  10/1987  Vermilyea .............................. 335/298
4,743,853   5/1988  Frese ..................................... 324/320
4,803,433   2/1989  McBride ............................... 324/318

Primary Examiner—Lincoln Donovan
Assistant Examiner—Raymond Barrera
Attorney, Agent, or Firm—Irving M. Freedman; Christian G. Cabou; Phyllis Y. Price

[57] ABSTRACT

In the installation of a superconducting magnet for magnetic resonance imaging at a preselected position in a mobile van, preselected curvilinear magnetic segments are applied to preselected locations on the exterior of the magnet to counteract magnet inhomogeneities in the imaging bore which would otherwise occur because of magnetic material in the van structure.

17 Claims, 2 Drawing Sheets

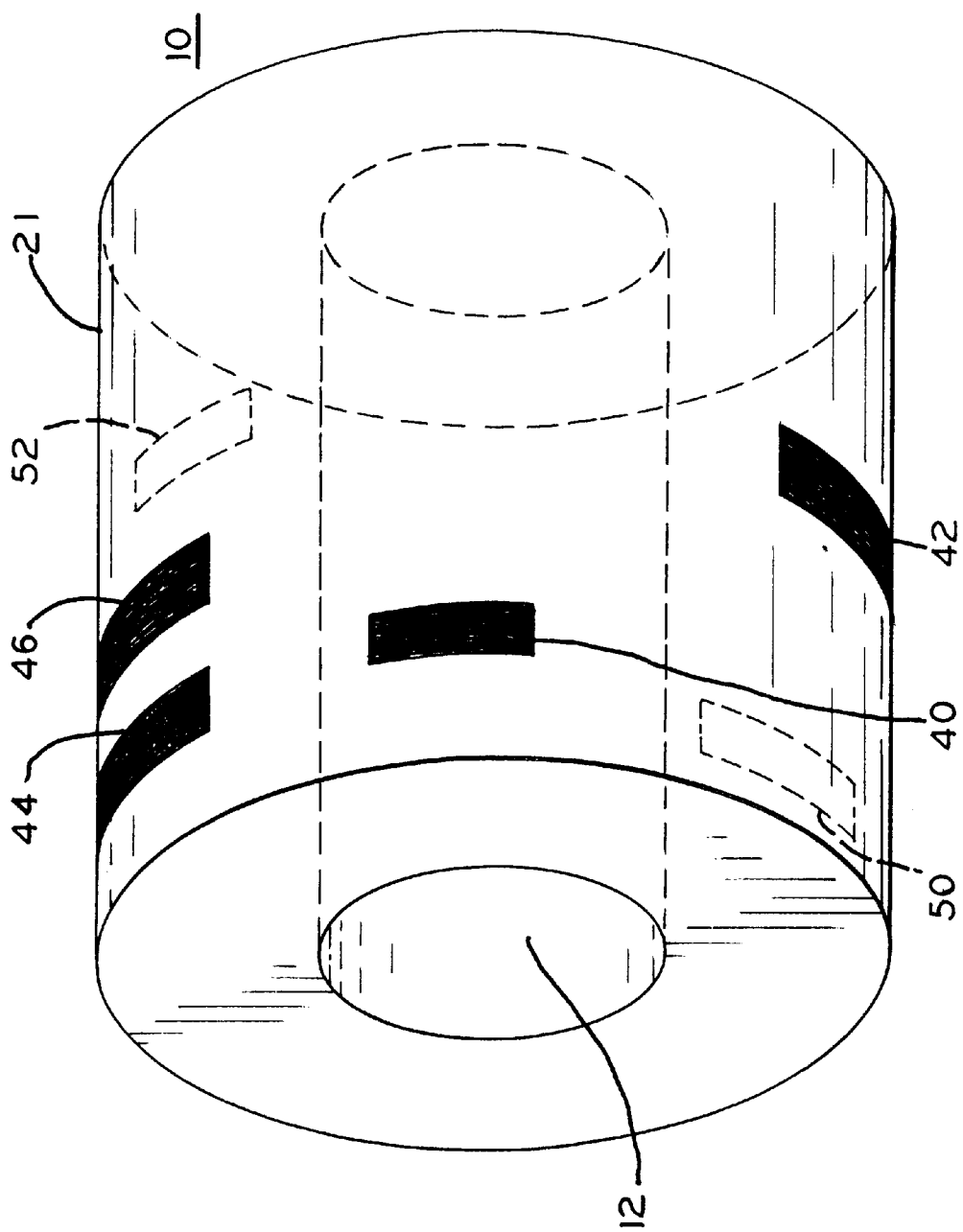
FIG_2

RESONANCE IMAGER MOBILE VAN MAGNETIC FIELD HOMOGENEITY SHIFT COMPENSATION

BACKGROUND OF INVENTION

This invention relates to a superconducting magnet assembly for a magnetic resonance imaging system (hereinafter called "MRI"), and more particularly to compensation for magnetic interference from mobile vans or vehicles in which the system is transported.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that when a power source is initially connected to the coil for a short period, current will continue to flow through the coils even after power is removed due to the absence of electrical resistance, thereby maintaining a strong magnetic field. Superconducting magnets find wide application in the field of MRI.

In a typical MRI magnet, the main superconducting magnet coils are enclosed in a cylindrical pressure vessel, contained within an evacuated vessel and forming an imaging bore along the axis. The main magnet coils develop a strong magnetic field in the imaging bore.

However, it is necessary for quality imaging to provide and maintain a highly homogeneous magnetic field in the imaging region. This has proven to provide problems for superconducting magnets which are suitable for, and used in, a variety of types of mobile vans in addition to more conventional fixed diagnostic clinics or hospital installations.

The magnetic field homogeneity in a mobile superconducting magnet is affected by the magnetic materials, such as carbon steel or other magnetic materials, around or in the vicinity of the magnets. Since a mobile van can have carbon steel in the floor, walls and roof, the magnetic field homogeneity of a MRI magnet will be distorted when it is installed in a mobile van. This magnetic field distortion is usually applied to a few inhomogeneity harmonics which are the decomposed components of the magnetic field. This provides difficulties in the magnet shimming processes normally utilized for obtaining a highly homogeneous magnet field, and often for mobile vans requires excessive amounts of magnetic passive shimming materials to be installed in the warm bore of the magnet. This may even result in a magnet that cannot be shimmed by conventional means.

An excessive amount of magnetic shims in the warm bore can cause several problems. Space in the warm bore is very limited preventing the installation of the large number of shims which may be required to provide the required imaging magnetic field homogeneity. Also. the installation of large amounts of shim materials requires a long shimming process, increasing the labor cost. In addition, the material properties of shims can be affected by temperature change and the temperature change in the warm bore is very large due to the activation of the electronics circuits and coils in the bore such that, the large amount of shims required in the bore would result in large magnetic shim property change due to the temperature change.

Still further, it is common for a particular superconducting magnet design or model to be carried by more than one type of mobile vehicle in addition to using the same design in fixed hospital or diagnostic clinic installations. It is highly desirable to be able to readily and effectively utilize the same production design of superconducting magnet in those various but different environments in which the magnetic material around the superconducting magnet varies.

SUMMARY OF INVENTION

Thus, there is a particular need for a superconducting magnet which can be utilized in fixed installations as well as in mobile installations with the ability to readily and effectively compensate for magnetic field shift due to the different magnetic materials proximate to the magnet in each such different kind of installation.

In accordance with one form of the invention, a superconducting magnet assembly for mobile van magnetic resonance imaging includes an evacuated cylindrical assembly with a central axial imaging bore. Compensation for the magnetic field distortion due to the magnetic structural elements of the mobile van include a plurality of curvilinear bands of magnetic material applied to preselected positions on the surface of the superconducting magnet assembly with the positions and magnetic material preselected for the particular mobile van to correct for inhomogeneities in the imaging bore. With different sets of bands and different preselected band positions, compensation of a standard superconducting magnet design may be readily accomplished for different mobile van configurations in addition to fixed installations.

DESCRIPTION OF DRAWINGS AND INVENTION

FIG. 2 is a simplified perspective view showing details of the invention.

Figure 1:
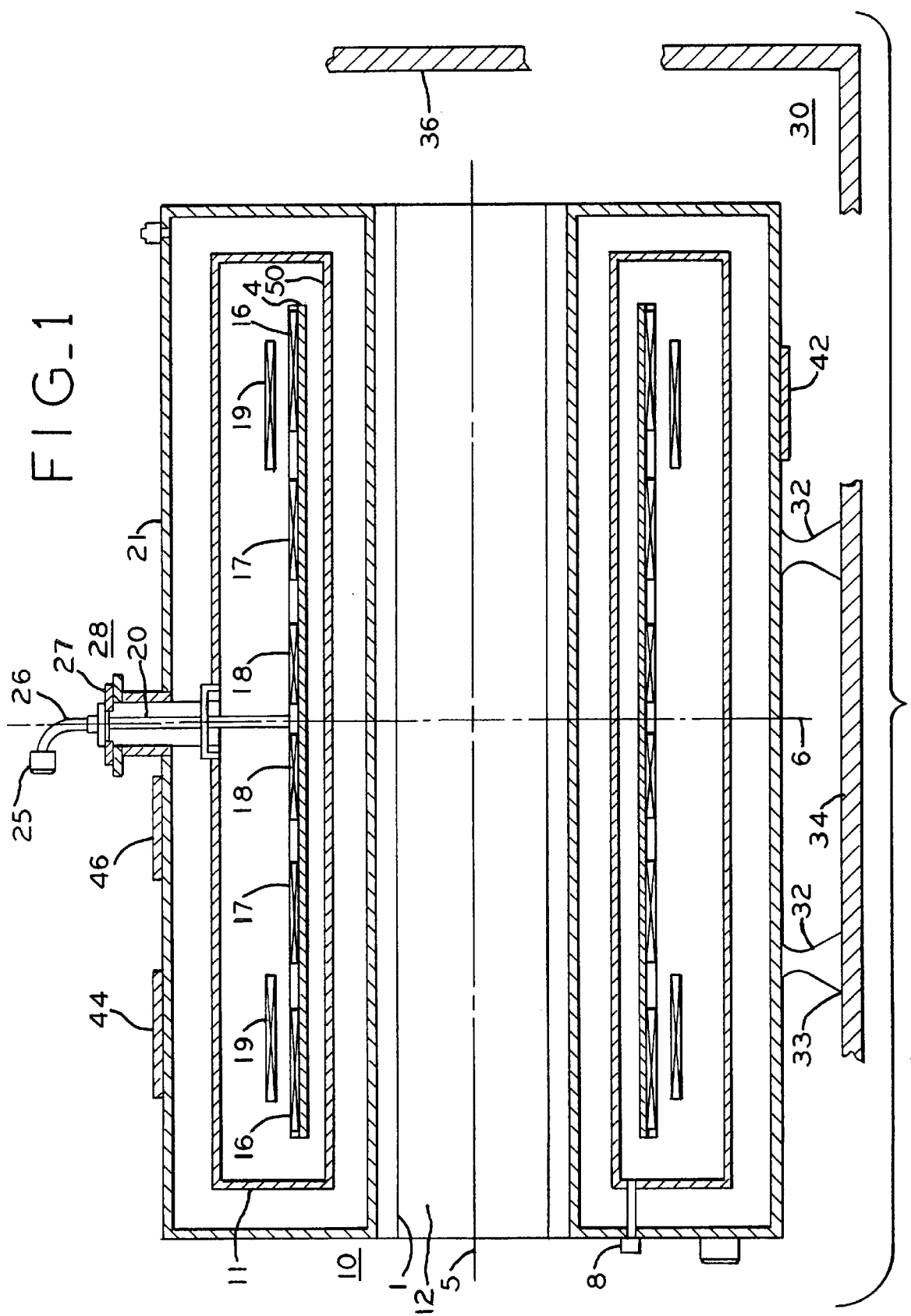
FIG. 1 is a sectional side view of a superconducting magnet incorporating the subject invention.

Referring to FIGS. 1 and 2, superconducting magnetic resonance imaging magnet assembly 10 includes pressure or cryogen vessel 11 concentrically within vacuum vessel 21 forming a central imaging bore 12 about axis 5. Positioned within pressure vessel 11 is composite drum 4 with three pairs of main magnet coils 16, 17 and 18 of decreasing axial length toward plane 6 perpendicular to axis 5. Main magnet coils 16, 17 and 18 are axially spaced and wound in axial slots on drum 4. Additional coils such as bucking coils 19 are provided to reduce the magnet's stray magnetic field.

External electrical power and control connections are provided through access port 28 by lead assembly 26 which includes connector 25 outside vacuum vessel 21 and conduit 20 passing through plate 27 for electrical connection to the components including magnet coils 16, 17, 18 and 19 within pressure vessel 11. In the case of liquid helium cooled MRI magnet assembly 10 liquid helium is provided through inlet pipe 8 to pressure vessel 11.

Superconducting magnet assembly 10, in the case of a mobile van installation, is positioned within a van 30 on supports 32 surrounded by carbon steel such as in the floor, walls and/or roof indicated schematically by floor 34 and walls 36.

A plurality of curvilinear bands 40, 42, 44 and 46 of magnetic material such as carbon steel are applied to the exterior of vacuum vessel 21 at locations predetermined and preselected for the particular type or model of mobile van in which superconducting magnet assembly 10 is installed. Typical bands for a mobile magnet may be 10 to 20 inches long, 1 to 5 inches wide, and ¼ to ½ inches thick. Magnet assembly 10 is positioned at a preselected position 33 on floor 34 of mobile van 30 such that the magnetic offset and resultant magnetic inhomogeneity in central imaging bore 12 resulting from the mobile van magnetic material will be essentially the same for all vans of a particular design or type. The size and placement of magnetic bands 40, 42, 44 and 46 can then be calculated and preselected for installations in that particular type of mobile van since the effect of that mobile van 30 on the magnetic field within imaging bore 12 is the same for all mobile vans of the same type.

The placement of sets of magnetic bands 40, 42 and 44 is thus the same for all mobile vans of the same type with other different sets of bands of different lengths and/or widths applied to preselected different locations such as 50, 52 indicated by dotted lines for a mobile van of a different type. Since there normally are limited number of mobile vans used for single type of superconducting magnet 10, the sets of magnetic bands such as 40, 42 and 44 and alternate band locations such as 50 and 52 will be limited, but will be preselected along with preselected locations for each type of van.

Superconducting magnet 10 without magnetic bands such as 40, 42 and 44 would be designed for non-mobile van fixed installation use such as for hospitals and diagnostic clinics enabling a single magnet design and production to be readily applicable and available for fixed installations without external bands such as 40, 42, 44 and 46, and also for use in multiple preselected mobile vans with the external bands. The applicable magnetic band sets and locations for the particular van are thus predetermined enabling ready modification of the standard design for the particular mobile van installation.

Superconducting bands such as 40, 42 and 44 counteract or compensate for the magnetic distortion in the magnetic field in imaging bore 12 which would otherwise occur in their absence because of the magnetic materials forming the van, resulting in correction or compensation of imaging magnetic field inhomogeneity in imaging bore 12. This enables improved and acceptable magnetic resonance imaging.

While the present invention has been described with respect to certain preferred embodiments thereof, it is to be understood that numerous variations and details of construction, the arrangement and combination of parts, and the type of materials used may be made without departing from the spirit and scope of the invention.

What is claimed is:

1. A superconducting magnet assembly suitable for different preselected installation locations including a plurality of mobile vans for magnetic resonance imaging, comprising:

a cylindrical evacuated assembly encircling a cryogen vessel including superconducting magnet coils therein with a central imaging bore about the axis of said assembly providing a magnetic field in said imaging bore;

a plurality of different types of mobile vehicles for transporting said superconducting magnet with each said mobile vehicle including magnetic elements which distort the homogeneity of the magnetic field produced by said superconducting magnet in said imaging bore; and a preselected location in each type of said mobile vehicle for the installation of said evacuated assembly;

a plurality of sets of external compensation means with each set to correct for the effect of said magnetic elements of one of said mobile vehicles on the homogeneity of said magnetic field;

each of said sets of compensation means including a plurality of preselected curvilinear bands of magnetic material;

preselected locations on said cylindrical evacuated assembly for each different type of said mobile vehicles for application of a selected set of said preselected bands to the exterior of said magnet assembly; and means to secure said preselected set of said curvilinear bands to said preselected locations;

whereby a preselected set of bands applied to said preselected locations for said mobile vehicle type corrects for inhomogeneities in said imaging bore which would otherwise result from installation of said superconducting magnet in said mobile vehicle.

2. The mobile superconducting magnet magnetic compensation system of claim 1 wherein said magnetic material are carbon steel bands applied to the exterior cylindrical surface of said superconducting magnet.

3. The mobile superconducting magnet magnetic compensation system of claim 2 wherein said evacuated assembly includes a vacuum vessel surrounding said cryogen vessel and said magnetic bands are applied to the exterior surface of said vacuum vessel.

4. The mobile superconducting magnet magnetic compensation system of claim 3 wherein said selection of locations is dependent on the amount and location of the steel walls and structure of the mobile van design for which compensation is to be provided.

5. The mobile superconducting magnet magnetic compensation system of claim 4 wherein said bands are secured to the outside of said superconducting magnet as said locations by securing means selected from glueing and welding.

6. The mobile superconducting magnet magnetic compensation system of claim 5 wherein said bands are in the range of 1–5 inches wide and 10–20 inches long.

7. The mobile superconducting magnet magnetic compensation system of claim 5 wherein said bands extend around the circumferential surface of said superconducting magnet.

8. The mobile superconducting magnet magnetic compensation system of claim 7 wherein said bands extend about said circumferential surface along a plane perpendicular to said axis.

9. A superconducting magnet assembly for magnetic resonance imaging suitable for installation at a fixed site and in one or more types of mobile vans, comprising:

a cylindrical outer vessel concentric about a cryogen vessel encircling, an imaging bore;

magnetic coils within said cryogen vessel to provide a homogeneous magnetic field within said imaging bore;

a plurality of preselected sets of external shimming means to minimize inhomogeneities of said magnetic field;

said shimming means including additional preselected sets of curved magnetic shim members for installation on the exterior of said vessel for the installation of said magnet assembly in a particular type of said one or more mobile vans;

said curved magnetic shim members of a preselected set installed in preselected positions on said exterior of said magnet assembly to correct for inhomogeneities in said imaging bore which would otherwise result from the magnetic material of said particular type of mobile van.

10. The mobile superconducting magnet assembly compensation system of claim 9 wherein said curved magnetic members are of predetermined sizes.

11. The mobile superconducting magnet assembly compensation system of claim 10 wherein said curved magnetic members are in the range of 1–5 inches wide and 10–20 inches long.

12. The mobile superconducting magnet assembly compensation system of claim 10 wherein the plurality of sets of said curved magnetic members and said preselected positions for each set enables the selective use of said superconducting magnet assembly in non-mobile installations without one of said set of curved magnetic members and optional use of the same magnet assembly in a plurality of types of mobile vans through selection and application to the exterior of said magnet assembly of the preselected set of curved magnetic members on said preselected positions for the type of van in which said magnet assembly is installed.

13. The mobile superconducting magnet assembly compensation system of claim 12 wherein said selection of locations is dependent on the amount and location of magnetic structure of the type of mobile van for which compensation is provided.

14. The mobile superconducting magnet assembly compensation system of claim 13 wherein said curved magnetic members are secured to the outside of said superconducting magnet at said locations with the securing selected from the group consisting of glueing and welding.

15. The mobile superconducting magnet assembly compensation system of claim 14 wherein said curved magnetic members are carbon steel.

16. The mobile superconducting magnet assembly compensation system of claim 15 wherein said curved magnetic members extend radially about the circumferential surface of said superconducting magnet along a plane perpendicular to the axis of said imaging bore.

17. The mobile superconducting magnet assembly compensation system of claim 16 wherein said magnet assembly is installed at a preselected location in said mobile van.

* * * * *